US012587141B2

(12) United States Patent
Masunaga et al.

(10) Patent No.: US 12,587,141 B2
(45) Date of Patent: Mar. 24, 2026

(54) MEASURING INSTRUMENT

(71) Applicant: HITACHI, LTD., Tokyo (JP)

(72) Inventors: Masahiro Masunaga, Tokyo (JP); Ryo Kuwana, Tokyo (JP); Shinji Nomoto, Tokyo (JP); Isao Hara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 499 days.

(21) Appl. No.: 18/119,338

(22) Filed: Mar. 9, 2023

(65) Prior Publication Data

US 2024/0080000 A1 Mar. 7, 2024

(30) Foreign Application Priority Data

Sep. 2, 2022 (JP) ................................. 2022-140368

(51) Int. Cl.
*H03F 1/26* (2006.01)
*G01L 19/00* (2006.01)
*G01L 27/00* (2006.01)

(52) U.S. Cl.
CPC ............ *H03F 1/26* (2013.01); *G01L 19/0092* (2013.01); *G01L 27/005* (2013.01)

(58) Field of Classification Search
CPC ..... H03F 1/26; G01L 19/0092; G01L 27/005; G01L 9/0051; G01L 9/0042; G01L 1/00; H01L 27/088; H01L 24/48; H01L 23/49838; H01L 2924/1424; H01L 2924/10272; H01L 2224/48227; G21C 17/00
USPC .................. 330/253, 308, 59, 297, 127, 129
See application file for complete search history.

(56) References Cited

U.S. PATENT DOCUMENTS

| | | | | |
|---|---|---|---|---|
| 7,830,220 B2 * | 11/2010 | Ceylan | ..................... | H03C 5/00 |
| | | | | 332/151 |
| 8,018,286 B2 * | 9/2011 | Christensen | .......... | H03F 1/0283 |
| | | | | 330/307 |
| 8,299,844 B2 | 10/2012 | Garverick et al. | | |
| 2021/0050348 A1 | 2/2021 | Kuwana et al. | | |

FOREIGN PATENT DOCUMENTS

JP        2021028620 A        2/2021

OTHER PUBLICATIONS

Extended European Search Report received in corresponding European Application No. 23159383.1 dated Sep. 1, 2023.

* cited by examiner

*Primary Examiner* — Andrea Lindgren Baltzell
*Assistant Examiner* — Nareh Shamiryan
(74) *Attorney, Agent, or Firm* — MATTINGLY & MALUR, PC

(57) ABSTRACT

The measuring instrument includes a sensor unit that measures a predetermined physical quantity; an amplifier circuit that amplifies a signal output from the sensor unit; and a linear power supply that supplies power to the amplifier circuit, in which the amplifier circuit includes a first amplifier having a first transistor using a SiC semiconductor, the linear power supply includes a second amplifier having a second transistor using the SiC semiconductor, and noise characteristics of the first amplifier are superior to noise characteristics of the second amplifier.

8 Claims, 6 Drawing Sheets

*FIG. 5*

CRYSTAL DEFECT DENSITY OF SiC [cm$^{-2}$]

MEASURING INSTRUMENT

CROSS-REFERENCE TO RELATED APPLICATIONS

The present application claims priority under 35 U.S.C. § 119 to Japanese Patent Application No. 2022-140368, filed Sep. 2, 2022, the contents of which is hereby incorporated by reference in its entirety.

BACKGROUND OF THE INVENTION

1. Field of the Invention

The present invention relates to a measuring instrument.

2. Description of Related Art

For example, the technique disclosed in JP2021-28620A is known for a circuit of a pressure transmission apparatus installed in a nuclear power plant. That is, JP2021-28620A describes a radiation-resistant circuit apparatus including "a SiC semiconductor on which a SiC integrated circuit is mounted, and a printed circuit board on which the SiC semiconductor is mounted."

Problems with circuits containing SiC semiconductors include the high price of wafers manufactured in the manufacturing process and the large deviation of low-frequency noise (variation between products). For example, in a case where circuits containing SiC semiconductors with low-frequency noise are selected, the yield of the product decreases, resulting in an increase in manufacturing cost. Further, in a case where the selection described above is not particularly performed, the deviation of the low-frequency noise increases and there is a high possibility that some products have a large amount of low-frequency noise, resulting in deterioration of quality.

As described above, in circuits including SiC semiconductors, there is a trade-off relationship between reducing the influence of noise and improving the yield. In circuits including SiC semiconductors, it is desirable to increase the yield while reducing the influence of noise, but JP2021-28620A does not describe such a technique.

SUMMARY OF THE INVENTION

Therefore, an object of the invention is to provide a measuring instrument capable of reducing the influence of noise and increasing the yield.

In order to solve the above-described problems, a measuring instrument according to the invention includes: a sensor unit that measures a predetermined physical quantity; an amplifier circuit that amplifies a signal output from the sensor unit; and a linear power supply that supplies power to the amplifier circuit, in which the amplifier circuit includes a first amplifier having a first transistor using a SiC semiconductor, the linear power supply includes a second amplifier having a second transistor using a SiC semiconductor, and noise characteristics of the first amplifier are superior to noise characteristics of the second amplifier.

According to the invention, it is possible to provide a measuring instrument capable of reducing the influence of noise and increasing the yield.

BRIEF DESCRIPTION OF THE DRAWINGS

FIG. 5 is a cross-sectional view of an n-type transistor and a p-type transistor used in the first amplifier and the second amplifier of the measuring instrument according to the first embodiment;

DESCRIPTION OF EMBODIMENTS

First Embodiment

<Configuration of Measuring Instrument>

Figure 1:
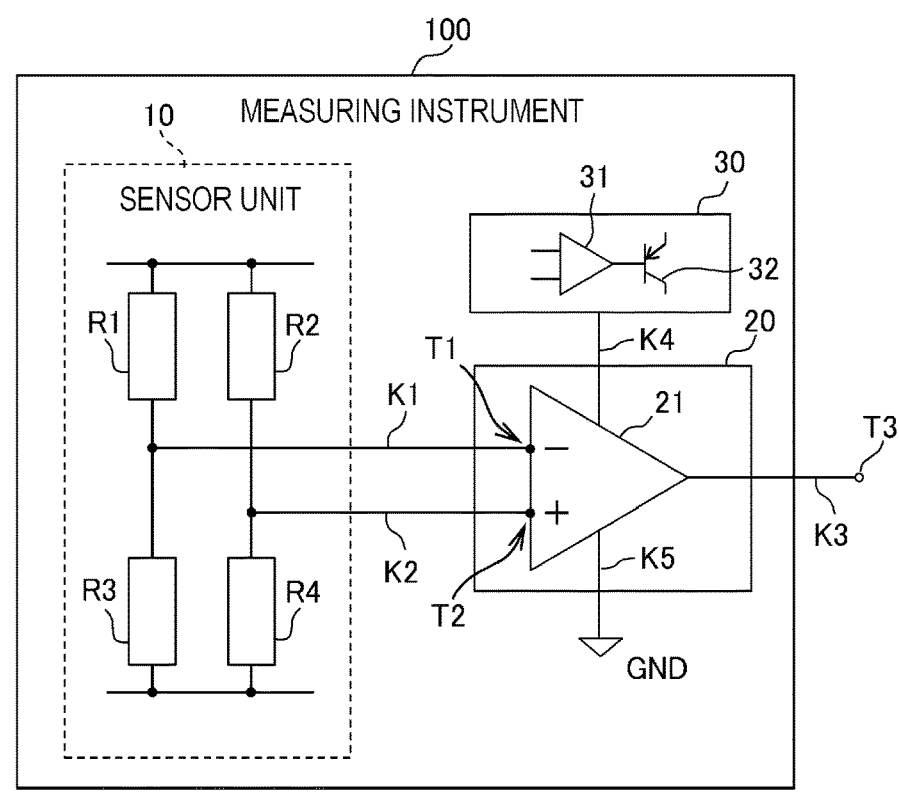
FIG. 1 is a configuration diagram of a measuring instrument according to a first embodiment.

FIG. 1 is a configuration diagram of a measuring instrument 100 according to a first embodiment.

The measuring instrument 100 shown in FIG. 1 is a device for measuring a predetermined physical quantity (state quantity). In the first embodiment, as an example, a case where the measuring instrument 100 is a pressure transmitter (pressure sensor) will be described, but the type of the measuring instrument 100 is not limited to this.

As shown in FIG. 1, the measuring instrument 100 includes a sensor unit 10, an amplifier circuit 20, and a linear power supply 30. The sensor unit 10 measures a predetermined physical quantity such as pressure. In the example of FIG. 1, the sensor unit 10 includes resistance elements R1, R2, and R3, and a strain gauge R4. The strain gauge R4 is an element that outputs a strain amount due to external pressure as a predetermined electric signal. For example, a predetermined pressure may be applied to the strain gauge R4, according to the hydraulic pressure in a tube (not shown) connected to the diaphragm (not shown).

As shown in FIG. 1, the resistance elements R1, R2, and R3, and the strain gauge R4 are connected to form a bridge circuit (Wheatstone bridge). Then, the output voltage of the bridge circuit is applied to the input side of the amplifier circuit 20 via the wirings K1 and K2. The voltage applied to the amplifier circuit 20 is amplified to a predetermined level by the amplifier circuit 20, and the amplified voltage is output via the output terminal T3. Although not shown in FIG. 1, the signal output from the output terminal T3 (voltage indicating the pressure value) is converted into a digital signal by an A/D converter, and is input to the integrated circuit (IC) for display. Further, the configuration of the sensor unit 10 shown in FIG. 1 is an example, and is not limited to this.

The amplifier circuit 20 is a circuit that amplifies the signal (voltage) output from the sensor unit 10 via the wirings K1 and K2. As shown in FIG. 1, the amplifier circuit 20 has a first amplifier 21. The first amplifier 21 is a circuit that amplifies the voltage applied between an inverting input terminal T1 and a non-inverting input terminal T2. In the example of FIG. 1, a wiring K1 is connected to the inverting input terminal T1 of the first amplifier 21, and a wiring K2 is connected to the non-inverting input terminal T2. The output side of the first amplifier 21 is connected to an output terminal T3 via a wiring K3. A high-voltage power supply line K4 of the first amplifier 21 is connected to the linear power supply 30. A low-voltage power supply line K5 of the first amplifier 21 is grounded. A circuit configuration of the first amplifier 21 will be described later.

The linear power supply 30 is a power supply that supplies power to the amplifier circuit 20, and is connected to the first amplifier 21 via the power supply line K4. A "linear power supply" is a power supply in which a switching operation is not particularly performed by a switching element. As described above, the linear power supply 30 does not particularly need to perform a switching operation, and therefore has the advantage of being less likely to fail even in a radiation environment. As shown in FIG. 1, the linear power supply 30 has a second amplifier 31 and a transistor 32. A circuit configuration of the linear power supply 30 will be described later.

Figure 2:
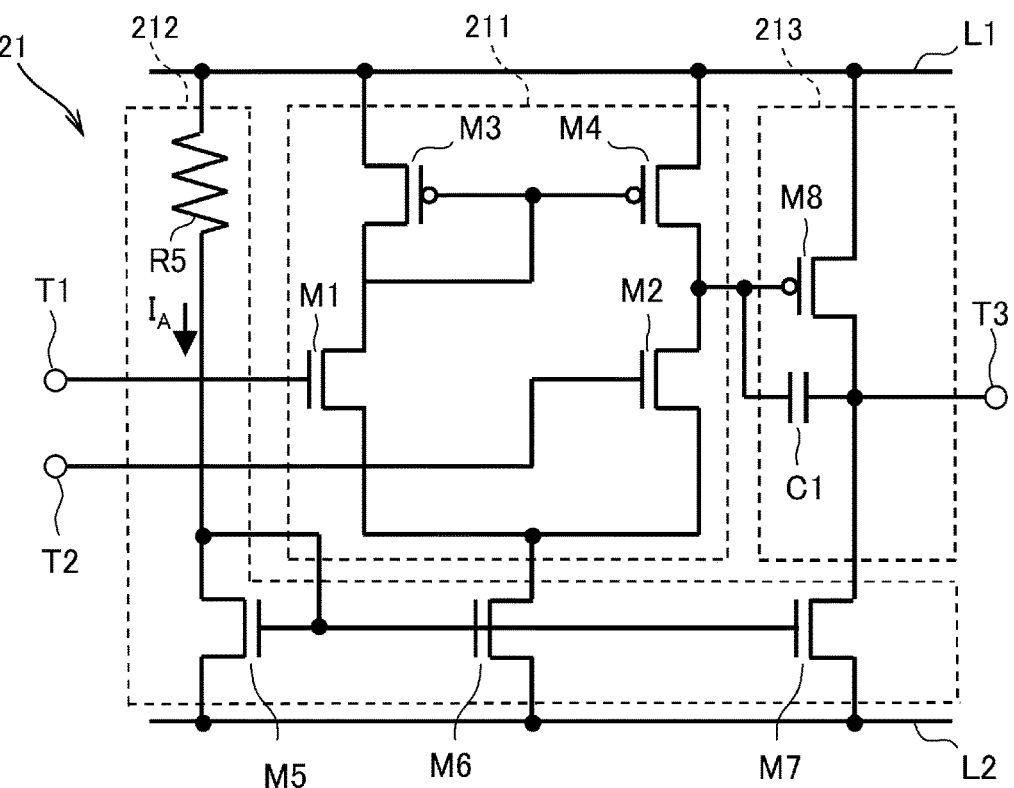
FIG. 2 is a circuit diagram of a first amplifier included in the measuring instrument according to the first embodiment.

FIG. 2 is a circuit diagram of the first amplifier 21 included in the measuring instrument.

As shown in FIG. 2, the first amplifier 21 includes a differential circuit 211, a current control circuit 212, and an output stage 213. The differential circuit 211, the current control circuit 212, and the output stage 213 are connected to both the high-voltage power supply line L1 and the low-voltage power supply line L2, respectively. A voltage is applied between the power lines L1 and L2 from the linear power supply 30 (see FIG. 1).

The first amplifier 21 includes transistors M1 to M8 (first transistors) using SiC semiconductors. In the example of FIG. 2, the transistors M1, M2, and M5 to M7 are n-channel type Metal-Oxide-Semiconductor Field-Effect Transistors (MOSFETs), and the remaining transistors M3, M4, and M8 are p-channel type MOSFETs. Hereinafter, "n-channel type" is simply referred to as "n-type", and "p-channel type" is simply referred to as "p-type".

In general, semiconductor elements are susceptible to radiation (especially γ-rays), but SiC semiconductors, which are one of wide bandgap semiconductors, have the advantage of being excellent in radiation resistance. Therefore, in the first embodiment, SiC semiconductors are used for the transistors M1 to M8 of the first amplifier 21, so that the radiation resistance of the first amplifier 21 is improved. Note that each of the transistors M1 to M8 operates in the saturation region.

The differential circuit 211 shown in FIG. 2 is a circuit that amplifies a differential voltage between the inverting input terminal T1 and the non-inverting input terminal T2, and includes transistors M1 to M4. The current control circuit 212 is a circuit for controlling the idling current $I_A$ of the transistor M5, and includes a resistance element R5 and transistors M5 to M7. The output stage 213 is a circuit for outputting the voltage amplified by the differential circuit 211, and includes the transistor M8 and a capacitor C1.

As shown in FIG. 2, a high-voltage power supply line L1 is connected to a low-voltage power supply line L2 through the p-type transistor M3, the n-type transistor M1, and the n-type transistor M6 in sequence. Similarly, the high-voltage power supply line L1 is connected to the low-voltage power supply line L2 through the p-type transistor M4, the n-type transistor M2, and the n-type transistor M6 in sequence.

The gate of the n-type transistor M1 is connected to the inverting input terminal T1. Further, a gate of the n-type transistor M2 is connected to the non-inverting input terminal T2. The gates of the p-type transistors M3 and M4 are connected to each other through a wiring. The gates of the n-type transistors M5 to M7 are connected to each other to form a current mirror circuit. Therefore, in the current control circuit 212, a current equal in magnitude to the idling current $I_A$ of the transistor M5 or a current corresponding to the gate width ratio of the transistor M5 also flows through the transistors M6 and M7.

The n-type transistor M5, which is a component of the current mirror circuit, is connected to the high-voltage power supply line L1 via a resistance element R5. The n-type transistor M7, which is a component of the current mirror circuit, is connected to the high-voltage power supply line L1 via the p-type transistor M8. A gate of the transistor M8 is connected between the transistors M2 and M4, and is connected to the output terminal T3 via the capacitor C1. Then, the voltage between the inverting input terminal T1 and the non-inverting input terminal T2 is amplified to a predetermined level, and the amplified voltage is output through the output terminal T3. Note that the configuration of the first amplifier 21 shown in FIG. 2 is an example, and the configuration is not limited to this.

Figure 3:
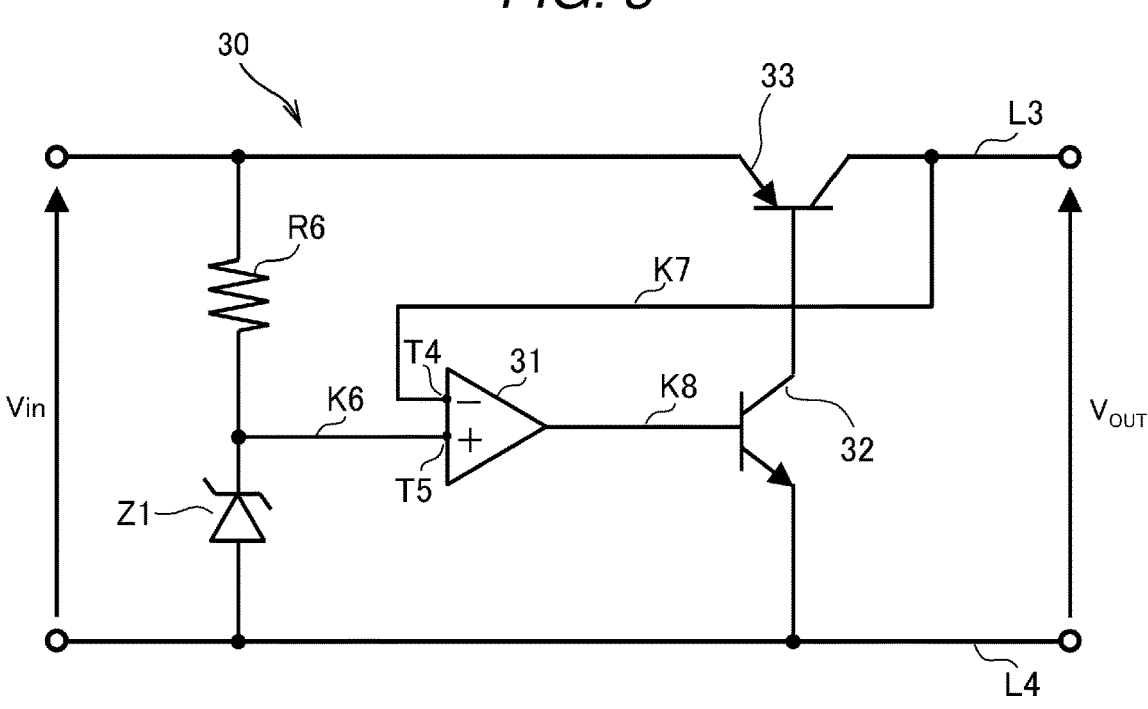
FIG. 3 is a circuit diagram of a linear power supply included in the measuring instrument according to the first embodiment.

FIG. 3 is a circuit diagram of the linear power supply 30 provided in the measuring instrument.

The linear power supply 30 is a power supply that supplies power to the first amplifier 21 (see FIG. 1), as described above. As shown in FIG. 3, the linear power supply 30 includes a Zener diode Z1, a resistance element R6, a second amplifier 31, and transistors 32, and 33. The Zener diode Z1 is an element in which when a predetermined Zener voltage (reverse voltage) is applied, the voltage across both ends becomes substantially constant regardless of a change in current.

The anode of the Zener diode Z1 is connected to a low-voltage power supply line L4. Further, the cathode of the Zener diode Z1 is connected to the non-inverting input terminal T5 of the second amplifier 31, and is also connected to the high-voltage power supply line L3 via the resistance element R6. By using such a Zener diode Z1, the potential of the non-inverting input terminal T5 of the second amplifier 31 is kept substantially constant, even when the input voltage $V_{in}$ fluctuates.

The second amplifier 31 is a circuit that amplifies the voltage applied between the inverting input terminal T4 and the non-inverting input terminal T5, and has a second transistor (not shown) using a SiC semiconductor. The configuration of the second amplifier 31 may be the same as the configuration of the first amplifier 21 (see FIG. 2) of the amplifier circuit 20 (see FIG. 1), or may be different from the configuration of the first amplifier 21. In the first embodiment, a case where the circuit configuration of the second amplifier 31 is the same as the configuration of the first amplifier 21 (see FIG. 2) will be described. Assuming that FIG. 2 is the circuit configuration of the second amplifier 31, the transistors M1 to M8 shown in FIG. 2 correspond to the "second transistor".

As shown in FIG. 3, the non-inverting input terminal T5 of the second amplifier 31 is connected between the Zener diode Z1 and the resistance element R6 via the wiring K6. Further, the inverting input terminal T4 of the second amplifier 31 is connected to the collector side of the transistor 33 in the high-voltage power supply line L3 via the wiring K7. The output side of the second amplifier 31 is connected to the base of the transistor 32 via the wiring K8.

The transistors 32 and 33 are bipolar transistors that amplify a current, according to the output of the second amplifier 31. The base of the transistor 32 is connected to the output side of the second amplifier 31, the emitter is connected to the low-voltage power supply line L4, and the collector is connected to the base of the other transistor 33.

The emitter of the other transistor 33 is connected to the input side of the high-voltage power supply line L3. The collector of the transistor 33 is connected to the output side of the high-voltage power supply line L3, and is also connected to the inverting input terminal T4 of the second amplifier 31 via the wiring K7. These transistors 32 and 33 each operate in the saturation region. A substantially constant output voltage $V_{OUT}$ is output from the linear power supply 30. Note that the configuration of the linear power supply 30 shown in FIG. 3 is an example, and is not limited to this.

Figure 4:
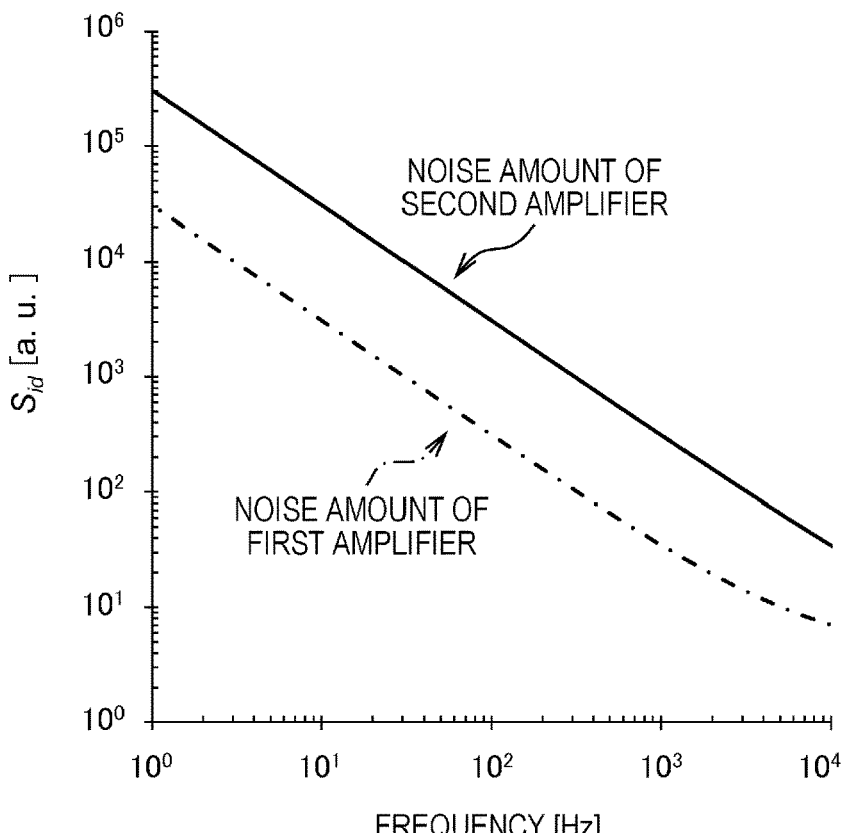
FIG. 4 is an explanatory diagram regarding noise amounts of the first amplifier and a second amplifier of the measuring instrument according to the first embodiment.

FIG. 4 is an explanatory diagram regarding noise amounts of the first amplifier and a second amplifier (see FIG. 1 as appropriate).

The horizontal axis of FIG. 4 represents the frequency of noise when a DC voltage is applied to the first amplifier 21 and the second amplifier 31. The vertical axis in FIG. 4 represents the noise amounts in the first amplifier 21 and the second amplifier 31. Note that $S_{id}$[a.u.] on the vertical axis means normalization by dividing the noise amount by the square of the drain current. As shown in FIG. 4, the noise amount of the first amplifier 21 is smaller than the noise amount of the second amplifier 31 when compared at the same frequency (noise frequency). That is, the noise characteristic of the first amplifier 21 is superior to the noise characteristic of the second amplifier 31.

In the example of FIG. 4, when the DC voltage is applied to the first amplifier 21 and the second amplifier 31, the noise amount of the first amplifier 21 is smaller than the noise amount of the second amplifier 31, within the range of $1.00 \times 10^0$ [Hz] to $1.00 \times 10^4$ [Hz] of the noise frequency. It is not particularly necessary that the noise amount of the first amplifier 21 is smaller than the noise amount of the second amplifier 31 over the entire range of noise frequency. For example, the noise amount of the first amplifier 21 may be smaller than the noise amount of the second amplifier 31, within a predetermined noise frequency range that is likely to occur when the first amplifier 21 and the second amplifier 31 are used. Such a case is included in the fact that the noise characteristic of the first amplifier 21 is superior to the noise characteristic of the second amplifier 31.

As described above, the SiC semiconductor used for each transistor of the first amplifier 21 and the second amplifier 31 has excellent radiation resistance. However, in the up-to-date technologies, a relatively high proportion of amplifiers fail in the inspection stage due to crystal defects peculiar to SiC semiconductors, which leads to a decrease in product yield and an increase in manufacturing costs. In order to reduce the noise of the measuring instrument 100, it is effective to select an amplifier with low-frequency noise at the inspection stage, but this causes a further decrease in product yield and an increase in manufacturing cost. Therefore, in the first embodiment, the noise amount of the amplifier is measured at the inspection stage, and the amplifier is classified into a low-noise amplifier and a high-noise amplifier.

As described above, the first amplifier 21 and the second amplifier 31 may have a common circuit configuration. Therefore, one type of amplifier is classified into a low-noise amplifier and a high-noise amplifier, and a low-noise amplifier is used for the first amplifier 21 (see FIG. 1) that processes the signal from the sensor unit 10 (see FIG. 1). A high-noise amplifier is used for the second amplifier 31 (see FIG. 1) of the linear power supply 30 (see FIG. 1), which is less susceptible to noise. Thus, the number of amplifiers which are rejected at the inspection stage due to, for example, high noise can be reduced, so that the unit price of the amplifiers can be reduced. Further, noise can be reduced by using a low-noise amplifier as the first amplifier 21 (see FIG. 1) of the amplifier circuit 20 (see FIG. 1) that is greatly affected by noise.

Figure 5:
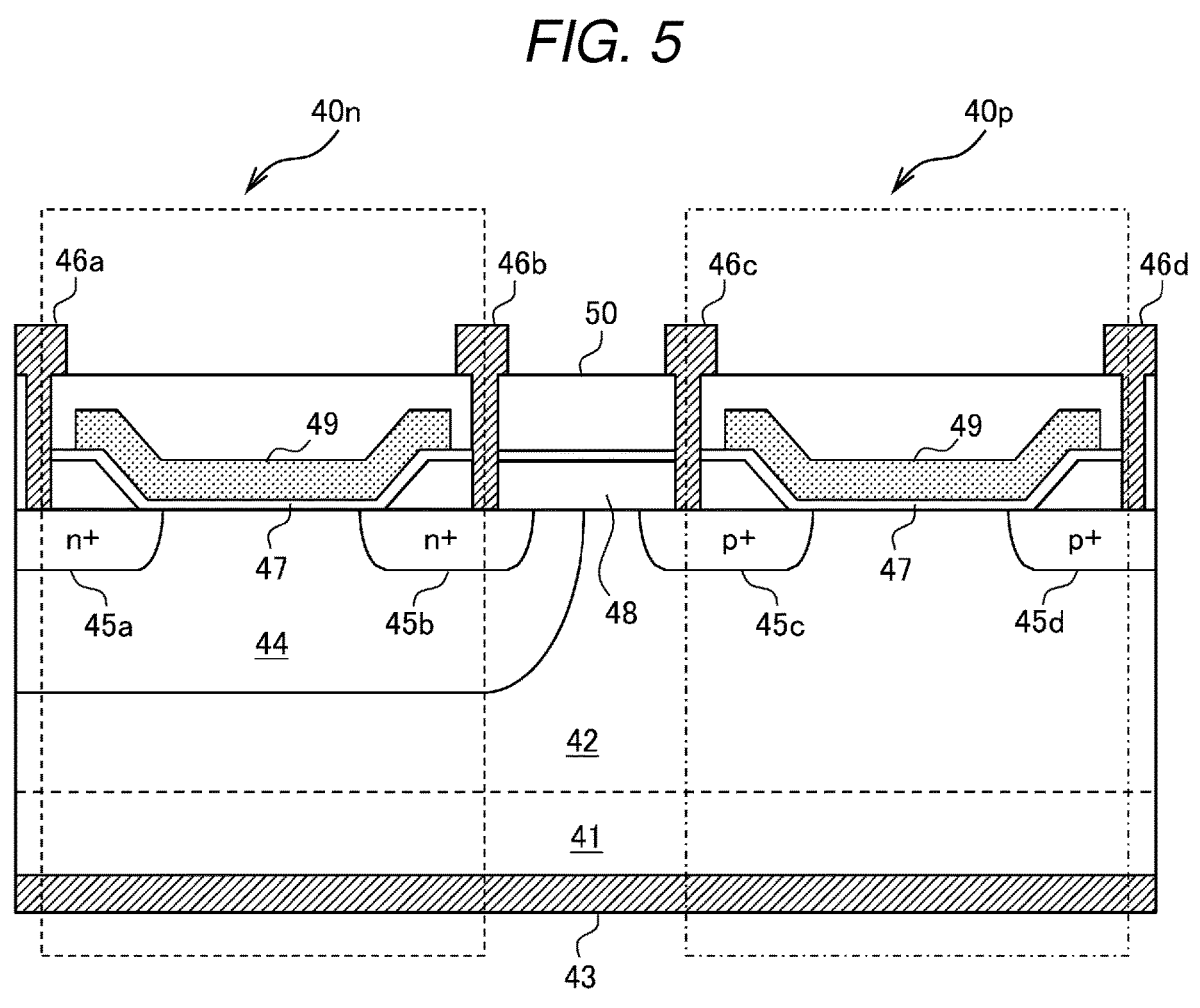

FIG. 5 is a cross-sectional view of an n-type transistor 40n and a p-type transistor 40p used in the first amplifier and the second amplifier.

The n-type transistor 40n shown in FIG. 5 is, for example, the transistors M1, M2, and M5 to M7 (see FIG. 2) described above. The p-type transistor 40p shown in FIG. 5 is, for example, the transistors M3, M4, and M8 (see FIG. 2) described above. Since the second amplifier 31 (see FIG. 3) may have the same circuit configuration as the first amplifier 21 (see FIG. 2), the transistors M1 to M8 are used. Although FIG. 5 shows the case where the n-type transistor 40n and the p-type transistor 40p are integrated, there is no particular need for the transistors to be integrated.

In the n-type transistor 40n shown in FIG. 5, an n-type epitaxial layer 42 (semiconductor layer) is formed on an n-type semiconductor substrate 41 made of a compound semiconductor such as silicon carbide (SiC). The epitaxial layer 42, like the semiconductor substrate 41, is made of a compound semiconductor such as silicon carbide (SiC). The impurity concentration of the epitaxial layer 42 is lower than the impurity concentration of the semiconductor substrate 41. A metal layer 43 is formed under the semiconductor substrate 41.

A p-type well region 44 is formed on the n-type epitaxial layer 42, in the n-type transistor 40n. In the p-type well region 44, n-type high-concentration impurity regions 45a and 45b having an impurity concentration higher than the impurity concentration of the semiconductor substrate 41 are formed. One of the high-concentration impurity regions 45a and 45b is the source of the transistor 40n and the other is the drain of the transistor 40n. Between these high-concentration impurity regions 45a and 45b, the p-type well region 44 described above is present. A wiring 46a is connected to the n-type high-concentration impurity region 45a. Similarly, a wiring 46b is connected to the other high-concentration impurity region 45b.

A gate insulating film 47 is formed on the n-type high-concentration impurity regions 45a and 45b and the p-type well region 44. A silicon oxide film, for example, is used as such a gate insulating film 47. The gate insulating film 47 protrudes upward in a region including the n-type high-concentration impurity regions 45a and 45b, and a field oxide film 48 is provided under the protruding portion. A silicon oxide film, for example, is used as such a field oxide film 48. A gate electrode 49 is formed on the gate insulating film 47. As such gate electrode 49, for example, a polycrystalline silicon film into which an n-type impurity is implanted is used. Below the gate electrode 49, the well region 44 between the high-concentration impurity regions 45*a* and 45*b* functions as a channel region.

An interlayer insulating film 50 is formed to cover the gate insulating film 47 and the gate electrode 49 from above. A silicon oxide film, for example, is used as such an interlayer insulating film 50. The wiring 46*a* described above passes through the interlayer insulating film 50, the gate insulating film 47, and the field oxide film 48 in order and is connected to the high-concentration impurity region 45*a* (the same applies to the other wiring 46*b*).

The configuration of the p-type transistor 40*p* shown in FIG. 5 is similar to the configuration of an n-type transistor 40*n* except that the well region 44 is not provided and that p-type impurities are implanted into the high-concentration impurity regions 45*c* and 45*d*. That is, the p-type high-concentration impurity regions 45*c* and 45*d* are formed on the n-type epitaxial layer 42, in the p-type transistor 40*p*.

Figure 6A:
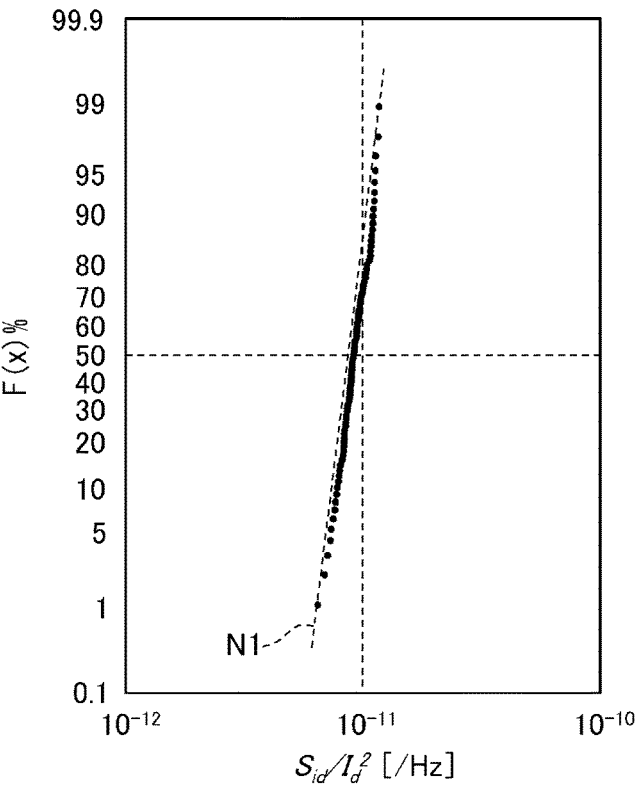
FIG. 6A is an explanatory diagram showing a frequency distribution of a noise amount of the n-type transistor included in the measuring instrument according to the first embodiment.

FIG. 6A is an explanatory diagram showing the frequency distribution of the noise amount of an n-type transistor.

The horizontal axis of FIG. 6A is the normalized value obtained by dividing the noise amount by the square of the drain current. The vertical axis of FIG. 6A is the cumulative frequency expressed as a percentage. In addition, as the measurement conditions of FIG. 6A, by applying a constant voltage of 3 [V] between the drain and source of the n-type transistor 40*n* (see FIG. 5), and applying a predetermined voltage between the gate and the source such that the drain current is set to 0.1 [mA], fluctuations (noise) in the drain current is measured with a spectrum analyzer (not shown). The same applies to the measurement conditions shown in FIG. 6B and FIG. 7, which will be described later.

As shown in FIG. 6A, in the n-type transistor 40*n*, the noise amount is about $1.00 \times 10^{-11}$ [/Hz], and each point of the frequency distribution based on the magnitude of the noise amount is distributed along a straight line N1 (a straight line with a steep positive slope). Therefore, the product of the n-type transistor 40*n* can be treated as having a noise amount of about $1.00 \times 10^{-11}$ [/Hz].

Figure 6B:
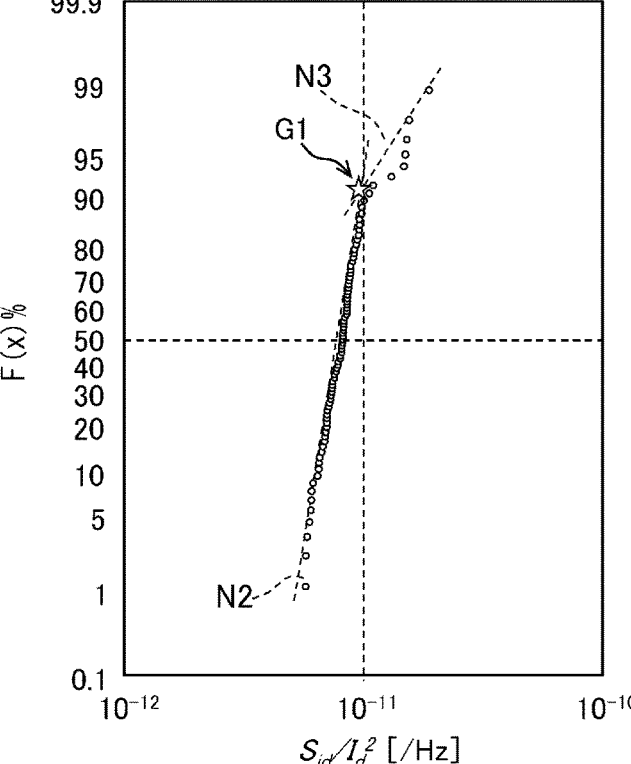
FIG. 6B is an explanatory diagram showing a frequency distribution of a noise amount of the p-type transistor included in the measuring instrument according to the first embodiment.

FIG. 6B is an explanatory diagram showing the frequency distribution of the noise amount of a p-type transistor.

The horizontal axis of FIG. 6B is the normalized value obtained by dividing the noise amount by the square of the drain current. The vertical axis of FIG. 6B is the cumulative frequency expressed as a percentage. As shown in FIG. 6B, in the p-type transistor 40*p*, each point up to the noise amount of about $1.00 \times 10^{-11}$ [/Hz] is distributed along a straight line N2 (a straight line with a steep positive slope). However, when the noise amount exceeds about $1.00 \times 10^{-11}$ [/Hz], the frequency distribution no longer follows the straight line N2, and the variation in noise amount increases.

Figure 7:
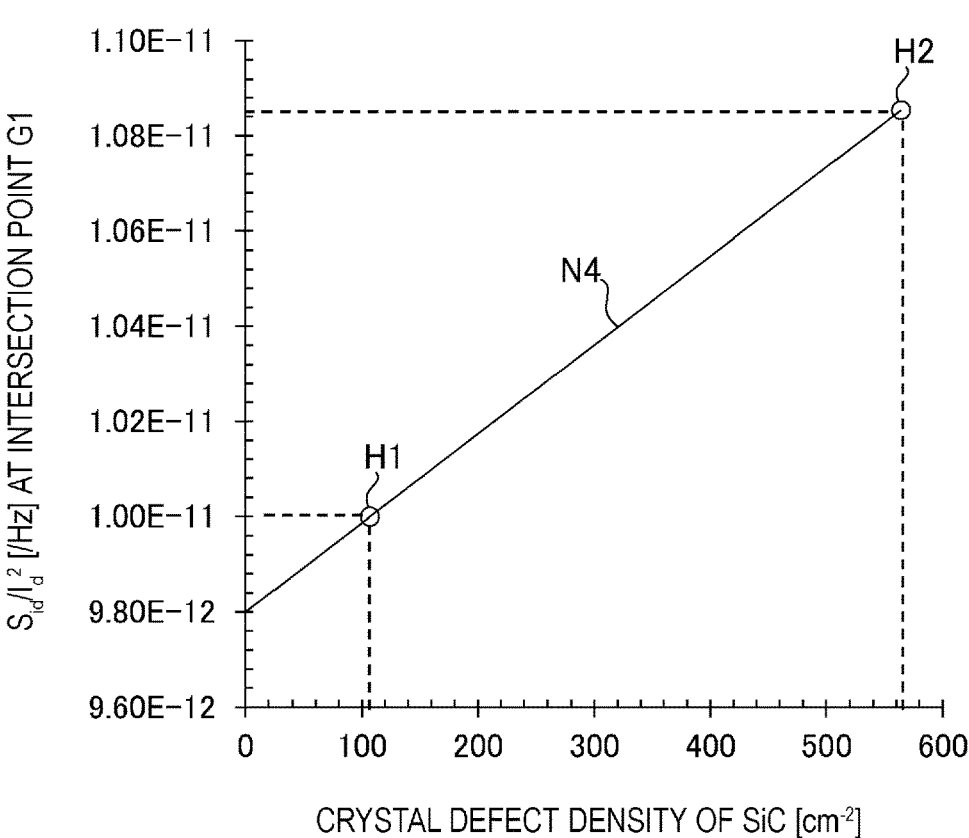
FIG. 7 is an explanatory diagram showing a relationship between a crystal defect density of SiC and a noise amount at an intersection point G1 in the measuring instrument according to the first embodiment.

FIG. 7 is an explanatory diagram showing a relationship between a crystal defect density of SiC and a noise amount at an intersection point G1.

The horizontal axis of FIG. 7 is the crystal defect density of the epitaxial layer 42 (see FIG. 5) made of SiC, in the p-type transistor 40*p* (see FIG. 5). The vertical axis of FIG. 7 is the noise amount at the intersection point G1 shown in FIG. 6B. That is, the noise amount when the frequency distribution (see FIG. 6B) based on the noise amount of the p-type transistor 40*p* (see FIG. 5) no longer follows the predetermined straight line N2 and begins to vary is the noise amount at the intersection point G1 (see FIG. 6B). "E-11" included in the numerical values on the vertical axis in FIG. 7 means $10^{-11}$, and "E-12" means $10^{-12}$.

Incidentally, the frequency distribution in FIG. 6B is for the transistor 40*p* in which the epitaxial layer 42 (see FIG. 5) made of SiC has a crystal defect density of about 100

[$cm^{-2}$] (corresponding to point H1 in FIG. 7). In FIG. 7, data for various transistors 40*p* having different crystal defect densities in the epitaxial layer 42 (see FIG. 5) is plotted. In FIG. 7, two points, a point H1 when the crystal defect density is about 100 [$cm^{-2}$] and a point H2 when the crystal defect density is about 570 [$cm^{-2}$], are plotted, but in reality, many points are plotted along the straight line N4.

For example, when the crystal defect density is about 100 [$cm^{-2}$], the frequency distribution based on the noise amount hardly varies and is distributed along a predetermined straight line N2 (see FIG. 6B), in the range where the noise amount is about $1.00 \times 10^{-11}$ or less (see the point H1 in FIG. 7 and the noise amount at the intersection point G1 in FIG. 6B). Similarly, when the crystal defect density is about 570 [$cm^{-2}$], the frequency distribution based on the noise amount is distributed along a predetermined straight line (not shown), in the range where the noise amount is about $1.08 \times 10^{-11}$ or less (see the point H2 in FIG. 7).

As shown in FIG. 7, the value (intercept) of the straight line N4 when the crystal defect density of the epitaxial layer 42 (see FIG. 5) made of SiC becomes zero is $9.80 \times 10^{-12}$ [/Hz]. Therefore, it is preferable to use the following as the noise characteristic of the "second transistor" of the second amplifier 31 (see FIG. 1) having a larger noise amount than the first amplifier 21 (see FIG. 1). That is, a normalized value obtained by dividing a noise amount of the "second transistor" by square of a drain current is preferably larger than $9.80 \times 10^{-12}$ [/Hz].

Thus, it is possible to reduce variation in the noise amount of the p-type transistor 40*p* of the first amplifier 21 regardless of the magnitude of the crystal defect density of SiC. As a result, the noise amount of the entire system can be treated as low, by regarding the noise amount of the transistor 40*p* as constant. Further, in order to reduce the variation in noise amount, it is also possible to use the method described below.

Figure 8:
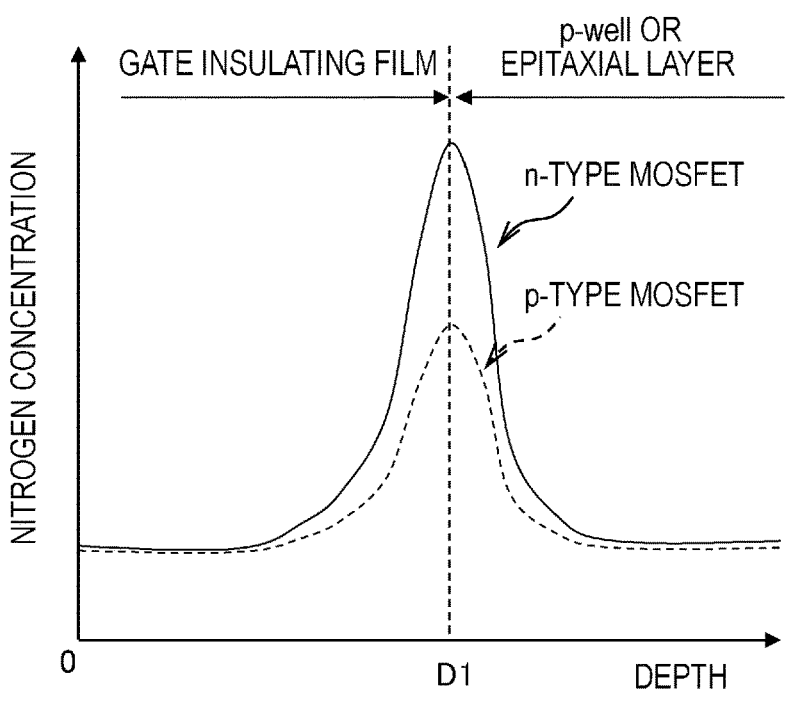
FIG. 8 is an explanatory diagram showing a relationship between a depth from an upper surface of a gate insulating film and a nitrogen concentration in the measuring instrument according to the first embodiment.

FIG. 8 is an explanatory diagram showing a relationship between the depth from the upper surface of the gate insulating film and the nitrogen concentration (see also FIG. 5 as appropriate).

The horizontal axis of FIG. 8 is the depth from the upper surface of the gate insulating film 47, and the vertical axis is the nitrogen concentration. Further, regarding the description of "p-well or epitaxial layer" in FIG. 8, "p-well" corresponds to the n-type transistor 40*n* (n-type MOSFET). That is, in FIG. 8, the depth of the interface between the well region 44 (p-well) and the gate insulating film 47 of the n-type transistor 40*n* is the value D1. Further, the "epitaxial layer" in FIG. 8 corresponds to the p-type transistor 40*p* (p-type MOSFET). That is, in FIG. 8, the depth of the interface between the epitaxial layer 42 and the gate insulating film 47 of the p-type transistor 40*p* is the value D1.

As shown in FIG. 8, in the n-type transistor 40*n* (n-type MOSFET), the closer to the interface (depth value D1) between the gate insulating film 47 and the well region 44, the higher the nitrogen concentration. Further, in the p-type transistor 40*p* (p-type MOSFET), the closer to the interface (depth value D1) between the gate insulating film 47 and the epitaxial layer 42, the higher the nitrogen concentration.

In the n-type transistor 40*n* using a SiC semiconductor, the interface between the gate insulating film 47 and the well region 44 is usually subjected to oxy-nitridation (NO annealing). The same applies to the p-type transistor 40*p* using a SiC semiconductor. However, in the p-type transistor 40*p*, due to nitrogen present at the interface between the gate insulating film 47 and the epitaxial layer 42, it is presumed that noise deviation (variation between products) increases because carriers are more likely to be trapped in defects near the interface. In the example of FIG. 6B, the frequency distribution based on the noise amount varies in the area where the noise amount exceeds about $1.00 \times 10^{-11}$ [/Hz].

Therefore, the inventors have found that variation in noise can be reduced by setting the nitrogen concentration at the interface between the gate insulating film 47 and the epitaxial layer 42 in the p-type transistor 40p (p-type MOSFET) lower than the nitrogen concentration at the interface between the gate insulating film 47 and the well region 44 in the n-type transistor 40n (n-type MOSFET).

As shown in FIG. 8, near the interface of the gate insulating film 47 of the p-type transistor 40p, the nitrogen concentration is lower than that of the n-type transistor 40n. This can reduce variation in noise presumed to be caused by nitrogen. It should be noted that the magnitude relationship between the nitrogen concentrations at the interface is the same for each transistor of the second amplifier 31 as well as the transistors M1 to M8 of the first amplifier 21 (see FIG. 2).

Further, the gate capacitance of the p-type transistor 40p is preferably larger than the gate capacitance of the n-type transistor 40n. For example, among the transistors M1 to M4 (first transistors) of the first amplifier 21 (see FIG. 2), the gate capacitances of the p-type transistors M3 and M4 (p-type MOSFETs) may be larger than the gate capacitances of the n-type transistors M1 and M2 (n-type MOSFETs).

Further, the gate capacitances of the p-type transistors M3, M4, and M8, including the remaining transistors M5 to M7, may be larger than the gate capacitances of the n-type transistors M1, M2, and M5 to M7. By increasing the gate capacitances of the p-type transistors M3, M4, and M8 in this manner, noise can be easily absorbed. It should be noted that the magnitude relationship between the gate capacitances described above is the same for the second amplifier 31 (see FIG. 1) as well as the first amplifier 21 (see FIG. 1).

Further, the nitrogen concentration (the number of nitrogen molecules per 1 cm 2) at the interface between the gate insulating film 47 and the epitaxial layer 42 in the p-type transistors M3, M4, and M8 (p-type MOSFETs) of the first amplifier 21 (see FIG. 2) is preferably $10^{10}$ [cm$^{-2}$] or more and $10^{14}$ [cm$^{-2}$] or less. By reducing the nitrogen concentration at the interface as described above, defects at the interface are reduced, and carrier trapping near the interface is less likely to occur. As a result, the noise of the first amplifier 21 is reduced. The same applies to each p-type transistor of the second amplifier 31 (see FIG. 3).

<Effect>

In the first embodiment, as the first amplifier 21 that processes the signal from the sensor unit 10, an amplifier having better noise characteristic than the second amplifier 31 used in the linear power supply 30 is used. This makes it possible to reduce the influence of noise in the measuring instrument 100. Further, a high-noise amplifier (that is, the noise characteristic is not so good), which has been rejected at the inspection stage, can be used as the second amplifier 31 of the linear power supply 30. Therefore, the yield can be improved, and the unit prices of the first amplifier 21 and the second amplifier 31 can be reduced. As a result, the manufacturing cost of the measuring instrument 100 can be reduced. As described above, according to the first embodiment, it is possible to achieve both the reduction in the influence of noise and the improvement of the yield in the measuring instrument 100.

Second Embodiment

The second embodiment differs from the first embodiment in that a measuring instrument 100A (see FIG. 9) includes a pressure sensor 10a (see FIG. 9) and a temperature sensor 10b (see FIG. 9) as a sensor unit 10A. Further, the second embodiment differs from the first embodiment in that the first amplifier 21a (see FIG. 9) is connected to the pressure sensor 10a, and another first amplifier 21b (see FIG. 9) is connected to the temperature sensor 10b. In addition, other aspects are similar to those in the first embodiment. Therefore, the portions different from the first embodiment will be described, and the overlapping portions will not be described.

Figure 9:
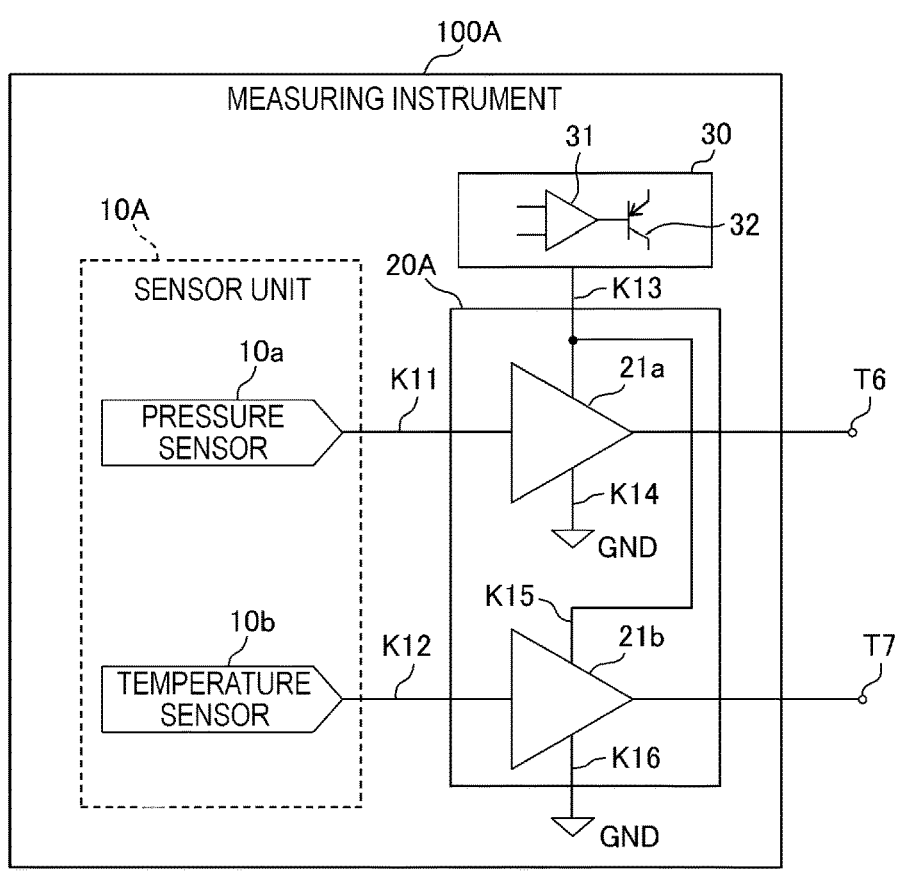
FIG. 9 is a configuration diagram of a measuring instrument according to a second embodiment.

FIG. 9 is a configuration diagram of the measuring instrument 100A according to the second embodiment.

As shown in FIG. 9, the measuring instrument 100A includes a sensor unit 10A, an amplifier circuit 20A, and a linear power supply 30. The sensor unit 10A includes the pressure sensor 10a and the temperature sensor 10b (another sensor). The pressure sensor 10a is a sensor that detects pressure (predetermined physical quantity). Since the configuration of the pressure sensor 10a is the same as that of the sensor unit 10 (see FIG. 1) described in the first embodiment, a description thereof will be omitted. The temperature sensor 10b is a sensor that detects temperature (predetermined physical quantity). Since the configuration of such a temperature sensor 10b is well known, detailed description thereof will be omitted.

As shown in FIG. 9, the amplifier circuit 20A includes first amplifiers 21a and 21b. The first amplifier 21a amplifies the signal output from the pressure sensor 10a, and is connected to the pressure sensor 10a via the wiring K11. In FIG. 9, for simplification, one wiring is shown as the wiring K11 connecting the pressure sensor 10a and the first amplifier 21a, but actually, the pressure sensor 10a and the first amplifier 21a are connected via two wirings (the same applies to the temperature sensor 10b). A predetermined signal is output via the output terminal T6 of the first amplifier 21a.

The first amplifier 21b (another first amplifier) amplifies the signal output from the temperature sensor 10b, and is connected to the temperature sensor 10b via the wiring K12. A predetermined signal is output via the output terminal T7 of the first amplifier 21b.

As shown in FIG. 9, the first amplifier 21a is connected to the linear power supply 30 via a high-voltage power supply line K13 and grounded via a low-voltage power supply line K14. The other first amplifier 21 is similarly connected to the linear power supply 30 via a high-voltage power supply line K15 and (part of) the power supply line K13 in sequence, and is grounded via the low-voltage power supply line K16. By supplying power from the common linear power supply 30 to the first amplifiers 21a and 21b in this manner, the configuration can be simplified and the manufacturing cost of the measuring instrument 100A can be reduced.

For example, in nuclear power plants and radiation utilization facilities, the pressure sensor 10a is often required to have higher detection accuracy than the temperature sensor 10b. In such a case, the noise characteristic of the first amplifier 21a connected to the pressure sensor 10a may be superior to the noise characteristic of the first amplifier 21b (another first amplifier) connected to the temperature sensor 10b (another sensor). For example, the noise amount of the amplifier may be measured at the inspection stage, and classified into three stages of low noise, medium noise, and high noise. A low-noise amplifier may be used for the first amplifier 21a connected to the pressure sensor 10a, a medium-noise amplifier may be used for the first amplifier 21b connected to the temperature sensor 10b, and a high-noise amplifier may be used for the second amplifier 31 of the linear power supply 30. This makes it possible to reduce the manufacturing cost of the measuring instrument 100A while reducing the influence of noise.
<Effect>

According to the second embodiment, the common linear power supply 30 is used as the power supply for supplying power to the first amplifier 21a connected to the pressure sensor 10a and the first amplifier 21b connected to the temperature sensor 10b. This makes it possible to simplify the circuit configuration of the measuring instrument 100A and reduce the manufacturing cost. Further, the first amplifier 21a connected to the pressure sensor 10a has better noise characteristics than the first amplifier 21b connected to the temperature sensor 10b. Thus, for example, in a nuclear power plant, the pressure of cooling water can be detected with high accuracy, while the temperature can also be detected with accuracy within an allowable range.

Third Embodiment

Figure 10:
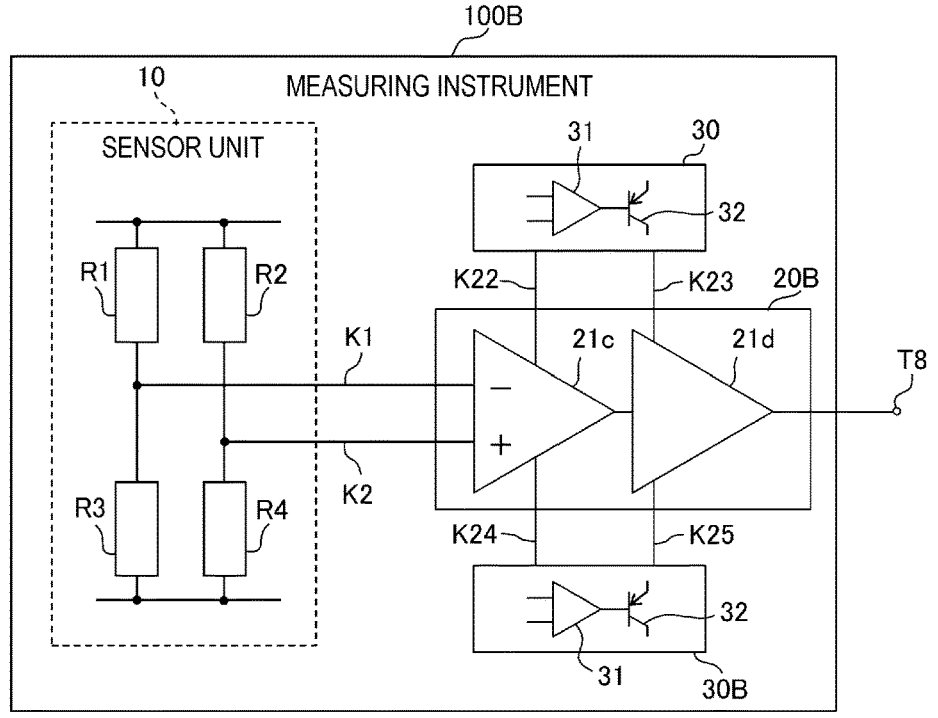
FIG. 10 is a configuration diagram of a measuring instrument according to a third embodiment.

The third embodiment differs from the first embodiment in that an amplifier circuit 20B (see FIG. 10) includes two first amplifiers 21c and 21d (see FIG. 10). Further, the third embodiment is different from the first embodiment in that the linear power supply 30 (see FIG. 10) is connected to the high-voltage side of the two first amplifiers 21c and 21d (see FIG. 10), and another linear power supply 30B (see FIG. 10) is connected to the low-voltage side. In addition, other aspects are similar to those in the first embodiment. Therefore, the portions different from the first embodiment will be described, and the overlapping portions will not be described.

FIG. 10 is a configuration diagram of a measuring instrument 100B according to a third embodiment.

As shown in FIG. 10, the measuring instrument 100B includes a sensor unit 10, the amplifier circuit 20B, and linear power sources 30 and 30B. The amplifier circuit 20B is a circuit for amplifying the signal from the sensor unit 10, and includes first amplifiers 21c and 21d. One first amplifier 21c is connected to the sensor unit 10 via wirings K1 and K2. The other first amplifier 21d is connected to one first amplifier 21c via a wiring K21. A predetermined signal is output via the output terminal T8 of the first amplifier 21d.

The linear power supplies 30 and 30B are power supplies that supply power to the first amplifiers 21c and 21d of the amplifier circuit 20B. As shown in FIG. 10, the linear power supply 30 (high-voltage linear power supply) is connected to the first amplifier 21c via the high-voltage power supply line K22, and is connected to the other first amplifier 21d via the high-voltage power supply line K23. The other linear power supply 30B (low-voltage linear power supply) is connected to the first amplifier 21c via a low-voltage power supply line K24, and is connected to the other first amplifier 21d via a low-voltage power supply line K25. The linear power supply 30B may have the same configuration as the other linear power supply 30, or may have a different configuration.

The noise characteristics of at least one of the first amplifiers 21c and 21d are preferably superior to any of the noise characteristics of the second amplifier 31 of the linear power supply 30 (high-voltage linear power supply) and the noise characteristics of the second amplifier 31B of the linear power supply 30B (low-voltage linear power supply). This makes it possible to increase the yield of each amplifier while reducing the influence of noise.

<Effect>

According to the third embodiment, by providing a plurality of first amplifiers 21c and 21d, it is possible to design the amplifier circuit 20B conforming to predetermined specifications. Further, the noise characteristics of at least one of the first amplifiers 21c and 21d are preferably superior to any of the noise characteristics of the second amplifier 31 of the high-voltage linear power supply 30 and the second amplifier 31B of the low-voltage linear power supply 30B. This makes it possible to increase the yield of each amplifier while reducing the influence of noise.

Modification Example

As described above, the measuring instrument 100 according to the invention has been described in each embodiment, but the invention is not limited to these descriptions, and various modifications can be made.

For example, in the first embodiment, the case where the linear power supply 30 has the configuration shown in FIG. 3 has been described, but the configuration is not limited to this. That is, in the linear power supply 30, an AC transformer (not shown) including an iron core and a coil may be used to step up or step down the voltage. The same applies to the second embodiment and the third embodiment.

In the second embodiment, the case in which the sensor unit 10A (see FIG. 9) includes the pressure sensor 10a and the temperature sensor 10b has been described, but the number and type of sensors in the sensor unit 10A can be changed as appropriate. Examples of physical quantities detected by sensors include, but are not limited to, mass, flow rate, illuminance, luminous intensity, sound volume, viscosity, current, and voltage in addition to pressure and temperature.

Further, in a configuration in which the sensor unit 10A (see FIG. 9) includes the pressure sensor 10a and another sensor that measures a physical quantity different from pressure, the noise characteristic of the first amplifier 21a connected to the pressure sensor 10a is preferably superior to the noise characteristic of another first amplifier connected to the other sensor. Thus, the pressure can be measured with high accuracy in a nuclear power plant, and other physical quantities can also be measured with accuracy within an allowable range.

Further, in the third embodiment, the configuration where the amplifier circuit 20B (see FIG. 10) includes two first amplifiers 21c and 21d, and the linear power supplies 30 and 30B (see FIG. 10) each include one second amplifier has been described, but the present invention is not limited to this. For example, the amplifier circuit may include a plurality of first amplifiers, and the linear power supply may include a plurality of second amplifiers. In such a configuration, it is preferable that a noise characteristic of at least one of the plurality of first amplifiers is superior to any of noise characteristics of the plurality of second amplifiers. Even with such a configuration, it is possible to increase the yield of products while reducing the influence of noise. Further, the noise characteristics of each of the plurality of first amplifiers may be superior to any of the noise characteristics of the plurality of second amplifiers. Such a configuration can further reduce the influence of noise.

Further, in a configuration in which the linear power supply includes a plurality of second amplifiers, a normalized value obtained by dividing a noise amount of the second transistor of at least one of the plurality of second amplifiers by square of a drain current may be larger than $9.80 \times 10^{-12}$ [/Hz]. This can reduce variation in noise regardless of the magnitude of the crystal defect density in the epitaxial layer 42 (see FIG. 5) made of SiC.

In each embodiment, the case where the transistors M1 to M8 (see FIG. 2) are MOSFETs has been described, but other types of transistors are also applicable.

Further, in each embodiment, the case where the type of the first amplifier 21 and the second amplifier 31 is a trans-impedance amplifier has been described, but other types of amplifiers such as operational amplifiers are also applicable.

Further, in each embodiment, the case where a SiC semiconductor is used for each of the transistors M1 to M8 included in the first amplifier 21 (see FIG. 2), and a SiC semiconductor is used for each of the transistors (not shown) included in the second amplifier 31 (see FIG. 3) has been described, but the present invention is not limited to this. For example, the plurality of transistors included in the first amplifier 21 may include transistors that do not contain a SiC semiconductor. Further, the plurality of transistors included in the second amplifier 31 may include a transistor that does not contain a SiC semiconductor.

Further, each embodiment can be appropriately combined. For example, in a configuration in which the second embodiment (see FIG. 9) and the third embodiment (see FIG. 10) are combined and the sensor unit 10A includes the pressure sensor 10a and the temperature sensor 10b (second embodiment), an amplifier circuit that amplifies a signal from each sensor may include a plurality of first amplifiers (third embodiment).

Further, in each embodiment, the case where the measuring instrument 100 (see FIG. 1) is used in nuclear power plants and radiation utilization facilities has been described, but the present invention is not limited to this. For example, the measuring instrument 100 can be used in various plants such as oil refining plants and chemical plants, as well as research facilities.

Further, each embodiment has been described in detail in order to explain the invention in an easy-to-understand manner and is not necessarily limited to those having all the configurations described. Further, for a part of the configuration of each embodiment, addition, deletion, or replacement of another configuration can be made.

Further, each of the above-described configurations, functions, processing units, and processing means may be partially or entirely realized by hardware, for example, by designing an integrated circuit. Further, mechanisms and configurations which are considered to be necessary for the explanation are indicated, and not all mechanisms and configurations are necessarily indicated on the product. Further, the control lines and the information lines which are considered to be necessary for the explanation are indicated, and not all control lines and information lines are necessarily indicated on the product. In fact, it may be considered that almost all constituent elements are interconnected.

What is claimed is:

1. A measuring instrument comprising:
a sensor unit that measures a predetermined physical quantity;
an amplifier circuit that amplifies a signal output from the sensor unit; and
a linear power supply that supplies power to the amplifier circuit, wherein

14 the amplifier circuit includes a plurality of first amplifiers each having a first transistor using a SiC semiconductor,
the linear power supply includes a plurality of second amplifiers each having a second transistor using a SiC semiconductor, and
a noise amount of at least one of the plurality of first amplifiers is smaller than the noise amount of any of the plurality of second amplifiers.

2. The measuring instrument according to claim 1, wherein
a normalized value obtained by dividing the noise amount of at least one of the second transistors by a drain current squared is larger than $9.80 \times 10^{-12}$ [/Hz].

3. The measuring instrument according to claim 1, wherein
a normalized value obtained by dividing the noise amount of at least one of the second transistors of at least one of the plurality of second amplifiers by a drain current squared is larger than $9.80 \times 10^{-12}$ [/Hz].

4. The measuring instrument according to claim 1, wherein
at least one of the first amplifier includes an n-type MOSFET and a p-type MOSFET, and
a gate capacitance of the p-type MOSFET is larger than a gate capacitance of the n-type MOSFET.

5. The measuring instrument according to claim 1, wherein
at least one of the first amplifier includes an n-type MOSFET and a p-type MOSFET, and
a nitrogen concentration at an interface between a gate insulating film and an epitaxial layer in the p-type MOSFET is lower than a nitrogen concentration at an interface between the gate insulating film and a well region in the n-type MOSFET.

6. The measuring instrument according to claim 5, wherein
the nitrogen concentration at the interface between the gate insulating film and the epitaxial layer in the p-type MOSFET is $10^{10}$ [cm$^{-2}$] or more and $10^{14}$ [cm$^{-2}$] or less.

7. The measuring instrument according to claim 1, wherein
the sensor unit includes a pressure sensor and another sensor that measures a physical quantity different from pressure, and
the noise amount of at least one of the first amplifier connected to the pressure sensor is smaller than the noise amount of another first amplifier connected to the other sensor.

8. The measuring instrument according to claim 1, wherein
the linear power supply includes a high-voltage linear power supply connected to at least one of the first amplifier via a high-voltage power supply line, and a low-voltage linear power supply connected to the at least one of the first amplifier via a low-voltage power supply line, and
the noise amount of the at least one of the first amplifier is smaller than the noise amount of at least one of the second amplifier of the high-voltage linear power supply and the noise amount of at least one of the second amplifier of the low-voltage linear power supply.

* * * * *